United States Patent [19]

Siroky

[11] Patent Number: 5,716,220
[45] Date of Patent: Feb. 10, 1998

[54] BACKPLANE ARRANGEMENT FOR ELECTRICAL EQUIPMENT

[75] Inventor: John Allen Siroky, Gahanna, Ohio

[73] Assignee: Lucent Technologies Inc., Murray Hill, N.J.

[21] Appl. No.: 361,928

[22] Filed: Dec. 22, 1994

[51] Int. Cl.⁶ .................................. H01R 9/09
[52] U.S. Cl. .................................. 439/61; 361/788
[58] Field of Search .................. 439/61, 65, 188, 439/67, 77; 29/596; 361/788

[56] References Cited

U.S. PATENT DOCUMENTS

| | | | |
|---|---|---|---|
| 4,420,793 | 12/1983 | Strandberg | 361/413 |
| 4,700,274 | 10/1987 | Laut | 361/393 |
| 4,810,917 | 3/1989 | Kumar et al. | 29/596 |
| 4,834,660 | 5/1989 | Cotti | 439/67 |
| 5,006,961 | 4/1991 | Monica | 439/61 |
| 5,319,526 | 6/1994 | Takashima | 439/65 |

*Primary Examiner*—Neil Abrams
*Assistant Examiner*—Eugene Byrd
*Attorney, Agent, or Firm*—Christopher N. Malvone

[57] ABSTRACT

A cylindrically shaped backplane contains conductors that provide circular buses that connect corresponding contacts of connectors mounted to the backplane. When circuit cards are inserted into the connectors, the circuit cards extend radially from the cylindrical backplane.

7 Claims, 2 Drawing Sheets

BACKPLANE ARRANGEMENT FOR ELECTRICAL EQUIPMENT

CROSS REFERENCE TO RELATED INVENTION

This application is related to commonly assigned and currently filed U.S. patent application entitled "Laminated Cylindrical Backplane", Ser. No. 08/362,064.

BACKGROUND OF THE INVENTION

1. Field of the Invention

The present invention relates to an electronic equipment arrangement; more specifically, a cylindrical backplane for electronic circuit cards.

2. Description of the Related Art

FIG. 1 illustrates a prior art backplane arrangement. Backplane 10 comprises upper connectors 12 and lower connectors 14. Contacts 16 within each connector pair, 12 and 14, mate with contacts on the surface of a circuit card. The contacts on the surface of the circuit card are positioned near the edge of the card so that they make contact with electrical contacts 16 when the card edge is inserted into the connector. Backplane 10 typically includes conductors that connect corresponding contacts on each of the connectors to create a bus structure. For example, contacts 18, 20, 22 and similarly positioned contacts of connectors 12, are connected to each other through the conductors of backplane 10. This arrangement provides a convenient busing connection between circuit cards that are designed to meet a particular input/output standard. For example, if contacts 18, 20, 22 and the corresponding contacts of connectors 12, are designated as a power contact, all circuit cards designed to mount to backplane 10 have a power contact that mates with the power contacts of connector 12 when the card is inserted into the connector.

Unfortunately, with today's high-speed circuitry, the horizontal length of backplane 10 has a finite limit, for example, ISA (Industry Standard Architecture) backplanes are limited to approximately 22 inches. If the horizontal dimension of the backplane is made larger, propagation delays and transmission line effects interfere with signal transmissions between cards that are at the far ends of the backplane. As a result, the number of circuit cards that can be mounted to backplane 10 is limited to the of circuit cards that can be mounted within a length of approximately 22 inches. Unfortunately, the circuit cards cannot be mounted too close to each other because of cooling requirements. If the cards are mounted too closely together, cooling air does not circulate sufficiently, and as a result the circuit cards overheat. Typically, 0.8 inches is provided between the circuit cards in a ISA backplane. As a result, only 25 circuit cards are mounted in a backplane such as backplane 10. This limits the amount of high-speed circuitry that can be positioned within a single backplane, and thereby limits the amount of functionality that can be provided.

SUMMARY OF THE INVENTION

The present invention addresses the aforementioned problems by providing an arrangement that reduces the maximum distance a signal must travel between circuit cards. Additionally, the invention provides an arrangement that permits the circuit cards to be mounted closer together without adversely effecting cooling. As a result, more circuit cards can be mounted on a single backplane while providing adequate cooling and better signal transmission characteristics.

The present invention provides a generally cylindrical backplane with the cards radially mounted along the circumference of the backplane. This arrangement decreases the maximum distance traveled by a signal to half the circumference of the backplane. Additionally, the radial mounting of the circuit cards enable closer card spacing while maintaining efficient cooling.

In one embodiment, the backplane is made of a flexible material so that the backplane can be bent into a cylindrical shape. The backplane contains conductors that provide an electrical connection between corresponding contacts of connectors attached to the backplane. The conductors also extend to the opposite ends of the backplane. At one end of the backplane, the conductors terminate in a connector, and at the other end of the backplane, the conductors terminate in contacts. When the backplane is bent into a cylindrical shape, and when the contact end of the backplane is inserted into the connector at the other end of the backplane, the conductors within the backplane form closed loops. The closed loops or circular busses connect corresponding contacts of the connectors mounted on the surface of the cylindrical backplane.

DETAILED DESCRIPTION OF THE INVENTION

Figure 1:
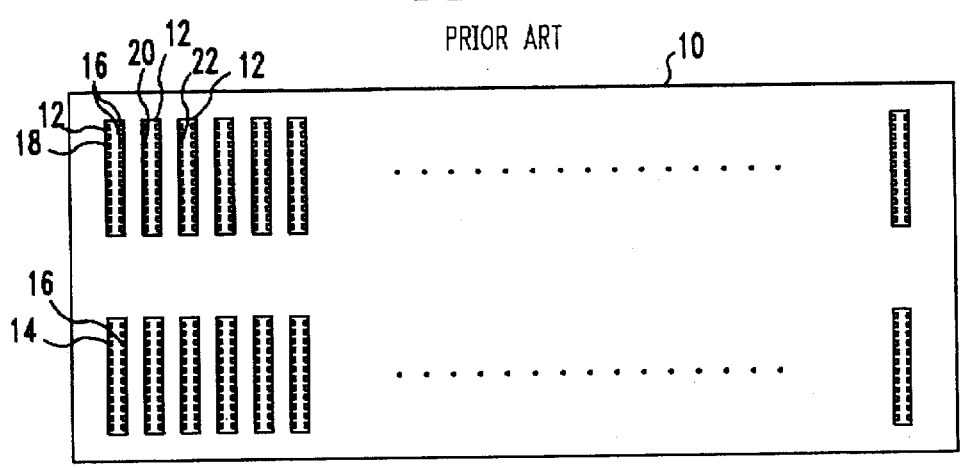
FIG. 1 illustrates a prior art backplane.
Figure 2:
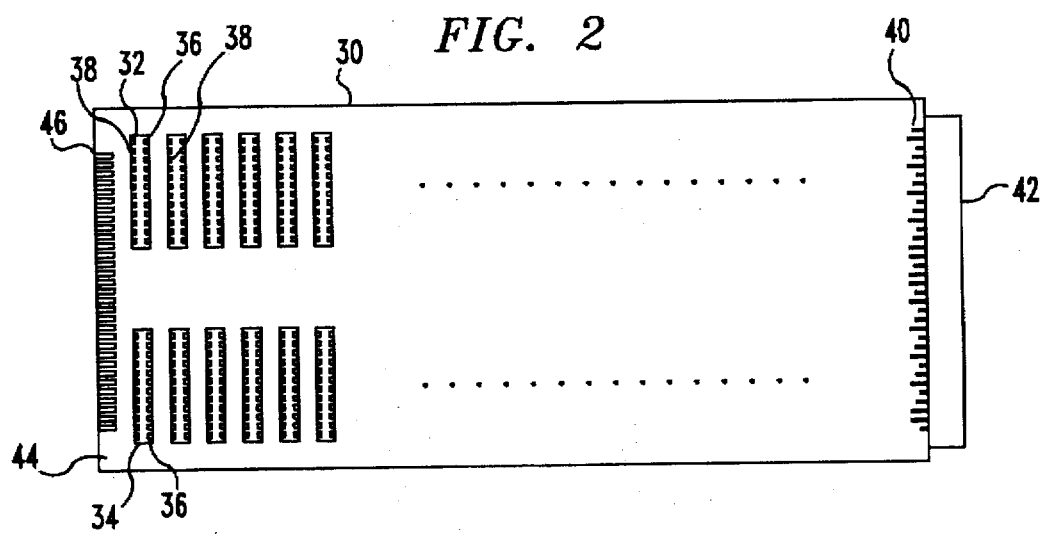
FIG. 2 illustrates an unrolled cylindrical backplane.

FIG. 2 illustrates the cylindrical backplane with its opposite ends disconnected. Flexible backplane 30 is made using a material such as Capton polyimide plastic film available from E. I. duPont de Nemours and Company, Inc. Upper connectors 32 and lower connectors 34 are mounted along the length of backplane 30. When a circuit card is inserted into connectors 32 and 34, contacts 36 of connectors 32 and 34 make electrical contact with conductive surfaces or contacts which are located on a surface near the edge of the circuit card. Corresponding or similarly positioned contacts of connectors 32 are connected onto a single bus via a conductor within or on backplane 30. For example, the contacts in position 38 of connectors 32 are connected to each other via a conductor within backplane 30. Similarly, corresponding contacts within connectors 34 are connected to each other via conductors within backplane 30. End 40 of backplane 30 includes connector 42. Connector 42 has a contact electrically connected to each of the conductors within or on backplane 30. That is, there is a contact within connector 42 for each of the corresponding sets of contacts within connectors 32 and 34. (For example, there is a contact within connector 42 for a conductor that connects contacts 38 of connectors 32.) Likewise, at end 44 of backplane 30, there is a conductive surface or contact 46 for each of the conductors within backplane 30. When cylindrical backplane 30 is bent into a cylindrical shape, and when end 44 of backplane 30 is inserted into connector 42, the contacts within connector 42 make electrical contact with conductive surface 46. This forms a closed loop conductor that connects corresponding or similarly positioned contacts for connector groups 32 and 34.

Figure 3:
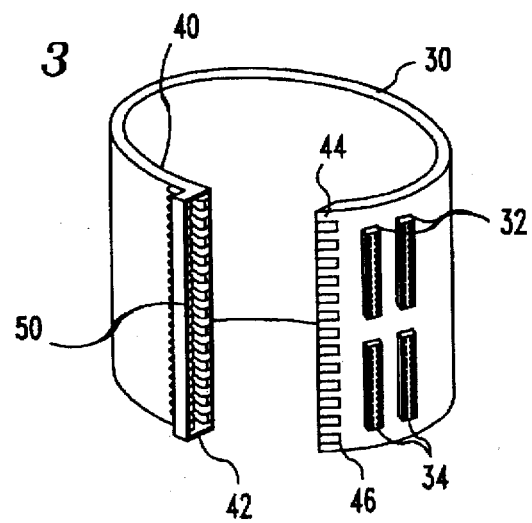
FIG. 3 illustrates the cylindrical backplane with its ends partially separated.

FIG. 3 illustrates backplane 30 when it is bent into a cylindrical shape so that connector 42 and end 44 are nearly in the mating position. When end 44 of backplane 30 is inserted into connector 42, contacts 46 are in electrical contact with contacts 50 of connector 42. As a result, the bus structure provided by backplane 30 is now in a circular or closed loop arrangement where there is a conductor in a looped configuration connecting corresponding contacts of connectors 32 and corresponding contacts of connectors 34.

Figure 4:
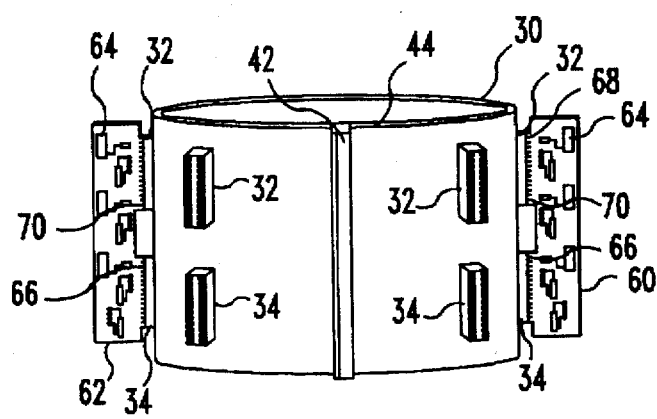
FIG. 4 illustrates the cylindrical backplane with circuit cards inserted into connectors.

FIG. 4 illustrates cylindrical backplane 30 with end 44 inserted into connector 42. Circuit cards 60 and 62 are each shown inserted into connectors 32 and 34 on backplane 30. The circuit cards include electrical components such as integrated circuits 64. Each circuit card contact 66 makes an electrical connection with the corresponding contact within connector 34, and each circuit card contact 68 makes an electrical connection with the corresponding contact within connector 32. As a result, corresponding contacts, such as contacts 70 of circuit cards 60 and 62, are connected on a bus in the form of a circular or closed loop conductor within or on backplane 30.

In one embodiment, the distance between ends 40 and 44 of backplane 30 is 22 inches. As a result of forming a cylindrical backplane, the maximum distance between circuit cards is now only approximately 14.5 inches rather than 22 inches. This circular design offers the advantage of reducing the propagation delay times and transmission line effects. By reducing transmission line effects, additional advantages can be achieved by eliminating terminating resistors typically included on a bus structure. By eliminating the terminating resistors, the load provided to a driving circuit is decreased which decreases power dissipation and increases transmission efficiency.

Figure 5:
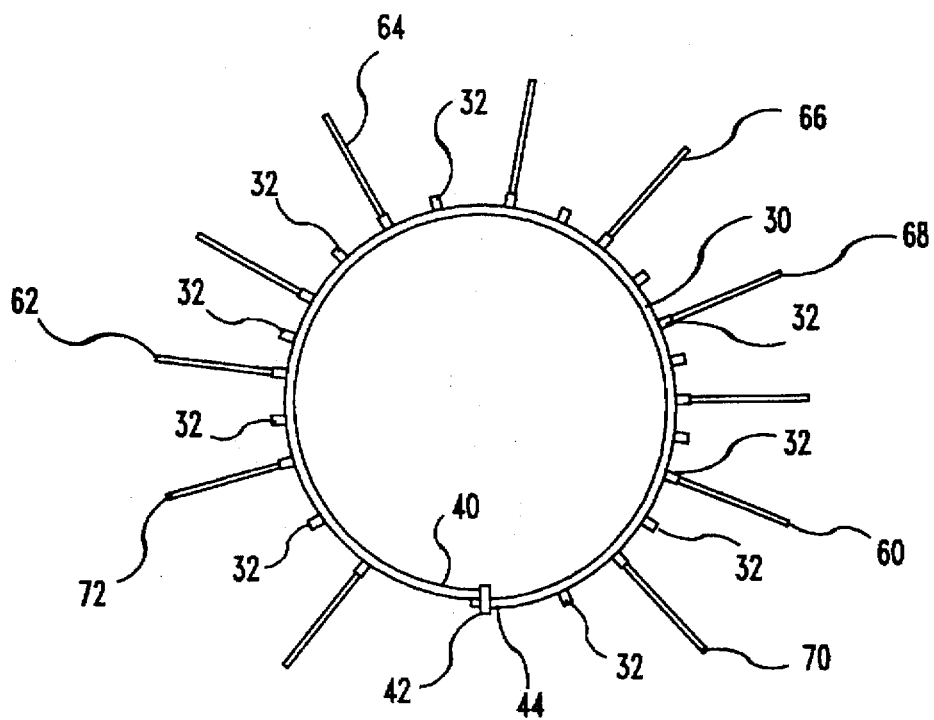
FIG. 5 is a top view of the cylindrical backplane of FIG. 4.

FIG. 5 is a top view of the arrangement of FIG. 4 with additional circuit cards inserted into the connectors of backplane 30. Circuit cards 60, 62, 64, 66, 68, 70 and 72 are shown inserted into connectors 32 and 34 on backplane 30. Additional connector pairs, 32 and 34, do not have circuit cards inserted and are therefore available for future additions. This arrangement provides efficient cooling when a fan is introduced below the cylindrical arrangement. Cool air is blown up through the circuit cards so that the warm air can rise out and away from the components on the cards. Since the cards are arranged in a radial fan-like orientation, adjacent sets of connectors 32 and 34 can be positioned very closely together without an over restriction of cooling air flow. As a result, adjacent connector pairs can be positioned as close as the body of the connector in use will allow. This offers the advantage of mounting more circuit cards on a single backplane. In addition, it is possible to provide electromagnetic shielding for this type of arrangement by using a cylindrical metal fixture that slides over the entire arrangement, including the circuit cards mounted radially to the cylindrical backplane.

The busing arrangement provided by backplane 30 can be any arrangement needed for a particular application, or it may use one of the standard arrangements such as a ISA bus or an EISA bus (Extended Industry Standard Architecture.)

Figure 6:
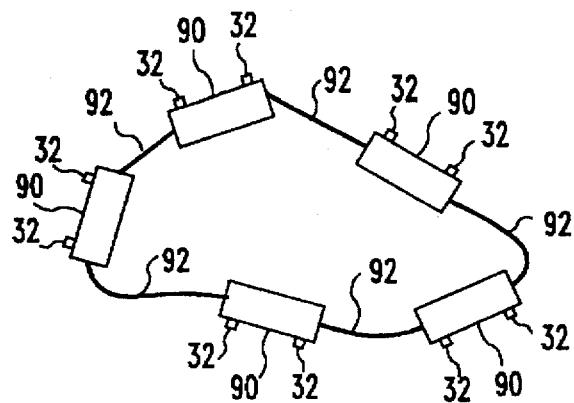
FIG. 6 is a top view of another embodiment of the invention.

FIG. 6 illustrates a top view of another embodiment of the invention. In this embodiment, the cylindrical backplane may be fabricated using several backplane sections 90 that are connected using flexible conductors such as ribbon cables 92. This printer fabricating the cylindrical backplane and its closed loop conductors using rigid sections connected to each other with flexible conductors.

Generally, unless zero insertion force connectors are used, it is desirable to provide each embodiment with a central core or ridged structure to facilitate card insertion.

I claim:

1. A backplane arrangement comprising:
   means for supporting a plurality of conductors; and
   a plurality of connectors mounted to said means for supporting, each of said connectors having a plurality of electrical contracts with corresponding electrical contacts of said connectors electrically connected to each other in a closed loop formed by at least one of said plurality of conductors.

2. The backplane arrangement of claim 1, wherein said closed loop comprises a connector.

3. The backplane arrangement of claim 1, wherein said means for supporting comprises a flexible material.

4. The backplane arrangement of claim 1, wherein said means for supporting forms a cylindrical shape.

5. The backplane arrangement of claim 1, further comprises a plurality of circuit cards inserted into said plurality of connectors so that said plurality of circuit cards extend radially from said means for supporting.

6. The backplane arrangement of claim 1, wherein said means for supporting comprises a plurality of rigid sections connected by flexible conductors.

7. A backplane arrangement, comprising:
   means for supporting a plurality of conductors, each of said conductors forming a closed loop, said closed loop being formed by inserting a first end of said supporting means into a connector mounted to a second end of said supporting means, said first end having a conductive surface in electrical contact with a conductor belonging to said plurality of conductors and said connector having a contact in electrical contact with said conductor, said conductive surface and said contact making an electrical connection when said first end is inserted into said connector; and
   a plurality of connectors adapted to receive an edge of a circuit card, said plurality of connectors mounted to said means for supporting, each of said connectors having a plurality of electrical contacts with corresponding electrical contacts of said connectors being in electrical contact with a same conductor belonging to said plurality of conductors.

* * * * *